(12) United States Patent
Nishiwaki et al.

(10) Patent No.: US 7,157,690 B2
(45) Date of Patent: Jan. 2, 2007

(54) IMAGING DEVICE WITH TRIANGULAR PHOTODETECTOR ARRAY FOR USE IN IMAGING

(75) Inventors: Seiji Nishiwaki, Kobe (JP); Michiyoshi Nagashima, Ikoma (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 11/092,431

(22) Filed: Mar. 29, 2005

(65) Prior Publication Data
US 2005/0218309 A1    Oct. 6, 2005

(30) Foreign Application Priority Data
Mar. 31, 2004 (JP) ............................ 2004-103771

(51) Int. Cl.
*H01L 27/00* (2006.01)
*H04N 9/00* (2006.01)

(52) U.S. Cl. .................. 250/226; 250/208.1; 348/273; 348/280; 348/315; 348/340; 348/294

(58) Field of Classification Search ............ 250/208.1, 250/219, 226, 216; 348/273, 280, 294, 315, 348/340
See application file for complete search history.

(56) References Cited

U.S. PATENT DOCUMENTS

| | | | |
|---|---|---|---|
| 6,252,218 B1 * | 6/2001 | Chou ....................... | 250/208.1 |
| 6,476,376 B1 * | 11/2002 | Biegelsen et al. .......... | 250/221 |
| 6,831,692 B1 * | 12/2004 | Oda ........................... | 348/315 |
| 6,833,873 B1 | 12/2004 | Suda | |
| 6,859,229 B1 | 2/2005 | Suda | |
| 7,012,719 B1 * | 3/2006 | Takahashi .................. | 358/474 |
| 2002/0020845 A1 | 2/2002 | Ogura et al. | |
| 2002/0067416 A1 | 6/2002 | Yoneda et al. | |
| 2002/0089596 A1 | 7/2002 | Suda | |
| 2002/0113888 A1 | 8/2002 | Sonoda et al. | |
| 2002/0122124 A1 | 9/2002 | Suda | |
| 2002/0163054 A1 | 11/2002 | Suda | |
| 2003/0086013 A1 | 5/2003 | Aratani | |

(Continued)

FOREIGN PATENT DOCUMENTS

EP      1 067 780 A2      1/2001

(Continued)

OTHER PUBLICATIONS

"Optical Alliance", 12, No. 5 (2001), pp. 1-14 (cited in the specification).

*Primary Examiner*—Stephone B. Allen
*Assistant Examiner*—Davienne Monbleau
(74) *Attorney, Agent, or Firm*—Renner, Otto, Boisselle & Sklar, LLP

(57) ABSTRACT

An imaging device includes at least three color filters, including first to third color filters having respectively different filtering characteristics; at least three lens systems, including first to third lens systems respectively associated with the first to third color filters; and a photodetection section. The photodetection section includes a first photodetector for receiving light transmitted through the first color filter and the first lens system, a second photodetector for receiving light transmitted through the second color filter and the second lens system, and a third photodetector for receiving light transmitted through the third color filter and the third lens system. Each of the first to third photodetectors has a two-dimensional array of photodetection cells such that centers of the photodetection cells are positioned at apices of triangles sharing respective sides with one another, where none of three corner angles of each triangle is equal to 90°.

20 Claims, 9 Drawing Sheets

U.S. PATENT DOCUMENTS

2004/0114047 A1* 6/2004 Vora et al. .................. 348/340
2005/0128335 A1* 6/2005 Kolehmainen et al. ..... 348/340

FOREIGN PATENT DOCUMENTS

| EP | 1 067 802 A2 | 1/2001 |
| JP | 2001-078214 | 3/2001 |
| JP | 2002-051351 | 2/2002 |
| JP | 2002-151672 | 5/2002 |
| JP | 2002-158913 | 5/2002 |
| JP | 2002-135796 | 10/2002 |
| JP | 2002-330332 | 11/2002 |
| JP | 2003-235053 | 8/2003 |

* cited by examiner

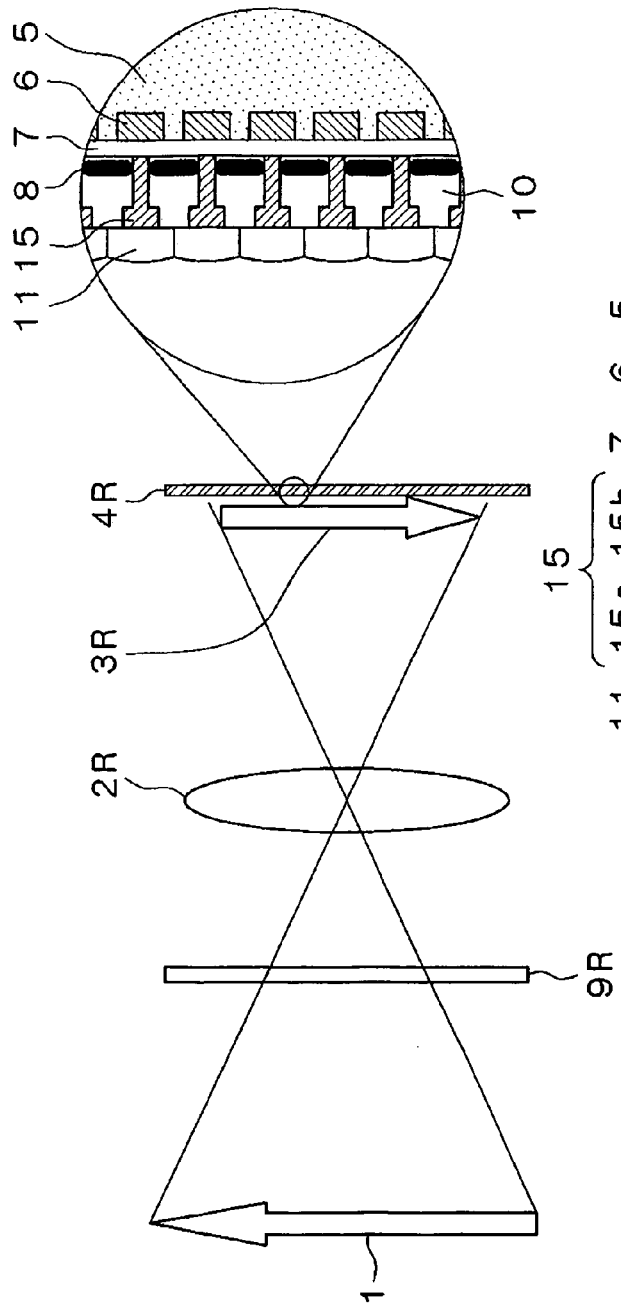
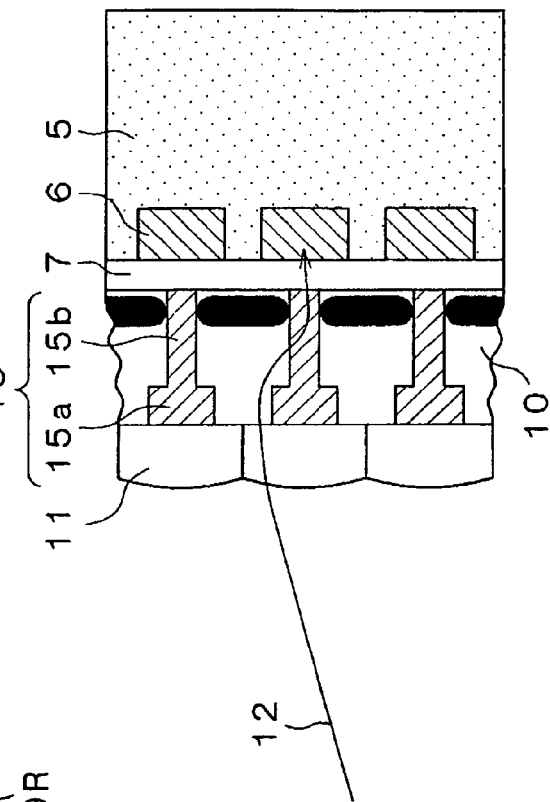
FIG. 2A
FIG. 2B

CONVENTIONAL ART

IMAGING DEVICE WITH TRIANGULAR PHOTODETECTOR ARRAY FOR USE IN IMAGING

BACKGROUND OF THE INVENTION

1. Field of the Invention

The present invention relates to an imaging device to be used for taking an image of an object, and a photodetector for use in imaging.

2. Description of the Related Art

In recent years, imaging devices such as CCDs and CMOS sensors are used widely in small-sized electronic appliances such as digital cameras and mobile phones. The structure of such an imaging device is disclosed in, for example, Optical Alliance, 12, No. 5 (2001) pp. 1–14.

Hereinafter, referring to FIGS. 8A and 8B, main component elements of conventional imaging device will be described. FIGS. 8A and 8B show cross-sectional structures of an imaging device and a photodetector for use in imaging, respectively.

As shown in FIG. 8A, light (e.g., natural light) which is reflected by an object 1 forms an image 3 on a light-receiving surface of a photodetector 4 (e.g., a CCD or a CMOS sensor), through a lens system 2. Although a commonly-used type of lens system 2 is a combination of a plurality of lenses which are arranged along an optical axis for realizing together a desired optical performance, it is assumed for simplicity herein that the lens system 2 is composed only of one lens.

The photodetector 4 comprises a substrate 5 having a two-dimensional array of photosensitive portions 6 arranged along a light-receiving surface, and a transparent layer 7 which is deposited on the light-receiving surface. A light-shielding mask 8 is embedded within the transparent layer 7, with color filters 9, a transparent layer 10, and microlenses 11 being stacked upon the light-shielding mask 8. Each unit structure (referred to as a "photodetection cell") from the photosensitive portion 6 to the microlens 11 detects light corresponding to a pixel of a single color. With respect to the three primaries of red (R), green (G), and blue (B), by combining signals obtained from the photodetection cells of the pixels corresponding to the three respective colors, a "color image" can be reproduced.

The photosensitive portions 6 are formed at nodes of an orthogonal lattice within the photodetection surface, the photosensitive portions 6 being insulated and spaced apart from one another. In these interspaces, interconnects for transferring detected signals are provided. In the case of a CCD, the interspaces will be used for vertical transfer and horizontal transfer. The light-shielding mask 8 is formed so as to overlie each interspace between the photosensitive portions 6, such that each single photosensitive portion 6 is not covered by the light-shielding mask 8. The center of each color filter 9 and the center of each microlens 11 are aligned with the center of the corresponding photosensitive portion 6, and each opening in the light-shielding mask 8 is covered by the corresponding color filter 9.

All photosensitive portions 6 in the two-dimensional array are of the same structure, whereas the color filters 9 fall into three types: red pass filters, green pass filters, and blue pass filters. The three types of color filters 9 have respective light-transmitting characteristics as follows: the red pass filters cut off light of any wavelength other than red; the green pass filters cut off light of any wavelength other than green; and the blue pass filters cut off light of any wavelength other than blue.

Every four photosensitive portions 6, i.e., one for red detection, one for green detection, one for blue detection, and one for brightness detection, compose a set. The four photosensitive portions 6 may be arranged in a clockwise order on a square, with red pass, green pass, blue pass, and green pass color filters 9 being employed respectively in combination therewith. Such an arrangement of color filters 9 is known as the Bayer pattern. The reason for using a green pass color filter 9 for brightness detection is that the human eyes are most sensitive to green. As shown in FIG. 8B, each microlens 11 refracts incident light which enters with an offset from the center axis of the microlens 11 (e.g., a ray 12), and deflects the light (which would otherwise have been blocked by the light-shielding mask 8) toward the opening, thus leading the light to the photosensitive portion 6.

FIG. 9A is an upper plan view showing a part of the conventional photodetector 4, where pixels 16 are arranged at nodes of an orthogonal lattice with equal distances (pitch Λ).

Resolution and brightness are among fundamental elements which govern the performance of an imaging device. Resolution is generally related to the total number of photosensitive portions 6 (number of pixels). However, under a fixed focal length f of the lens system 2, resolution is related to the size or density of the photosensitive portions 6.

On the other hand, brightness is related to the amount of light detected by each single photosensitive portion 6. As the size of the photosensitive portions 6 decreases, resolution is improved, but brightness is degraded because the amount of detected light decreases. Conversely, as the size of the photosensitive portions 6 increases, brightness is improved, but resolution is degraded.

Brightness is also related to the focal length f and the aperture (diameter D) of a lens. The value of f/D (=focal length/aperture) is referred to as an "F value". As the F value decreases, the resultant image becomes brighter. The reason is that, as D increases, the image becomes brighter because of being able to take in light through a broader area; as f decreases, the image becomes brighter because the size of the image is decreased, since the light intensity of an image generally increases in inverse proportion to the image size.

Resolution is also related to the optical performance of the lens system 2. If the lens system 2 has a high optical performance so that the image 3 is being reproduced all the way up to high frequency patterns (i.e., patterns with fine pitches), resolution is also improved. On the other hand, if the lens system 2 has a poor optical performance so that the image 3 can only be reproduced with respect to low frequency patterns, resolution is degraded. The microlenses 11 provides some contribution to brightness improvement because the microlenses 11 function to lead light which would otherwise have been blocked by the light-shielding mask 8 to the photosensitive portions 6.

The above-described conventional imaging device and photodetector for use in imaging have the following problems. As shown in FIG. 8B, for example, a ray 12' which is oblique with respect to the center axis of the microlens 11 is blocked by the light-shielding mask 8 because a lens has such general characteristics that it allows any light traveling through its principal point to pass straight through. Therefore, the effect of the microlenses 11 is not sufficient, and the detection efficiency will always be worse for any oblique ray. For example, at the center axis of the lens system 2, i.e., in a region away from the center of the photodetector 4, the rays are greatly tilted with respect to a normal of the detection surface, so that the brightness is not sufficient as compared to the neighborhood of the center of the photodetector 4; thus, a correction process will have to be performed during image processing. This problem associated with oblique rays requires that a telecentric condition be satisfied at the image side (i.e., rays must be parallel to the optical axis at the image side) in the optical designing of the lens system, thus imposing substantially constraints on design freedom.

On the other hand, FIG. 9B illustrates a case where a bright-dark pattern having a pitch close to the pitch Λ of the pixels 16 (the pitch of the pattern being 10Λ/9 in the illustrated example) is projected onto the photodetector 4. The bright-dark pattern has dark lines 13 which lie upon the pixels 16 at the right and left ends of FIG. 9B, and lie between pixels 16 in the central portion of FIG. 9B. As a result, a pattern which appears bright near the center and dark at the right and left ends of FIG. 9B will be detected as a pseudo signal, the pseudo signal having a large period which is quite different from that of the actual bright-dark pattern.

This stripe pattern is generally known as moire fringes. Since there are four cycling directions of the pixel 16, i.e., the vertical direction, the horizontal direction, and two oblique directions, moire fringes may be caused by a dark pattern which cycles in any of these four directions. In order to prevent moire fringes, the performance of the optical system is intentionally deteriorated with respect to its frequency characteristics in conventional examples (thus lowering the resolution of the optical system, as it were), so that any bright-dark pattern having a pitch close to the pitch Λ of the pixels 16 will be blurred. In other words, the optical system combination is designed to result in a resolution which is lower than the resolution as determined by the number of pixels based on the photosensitive portions 6. As a method for lowering the resolution of the optical system, design parameters may be accordingly adjusted, or alternatively, a birefringent substrate may be placed in a slanted position in front of the photodetector 4 so as to cause blurring of light via birefringence effects. However, when this situation is viewed from the photodetector side, it would appear that a photodetector 4 having a resolution which is unnecessarily higher than the resolution of the optical system is being employed; thus, together with the addition of the birefringent substrate, the overall cost is being increased.

Moreover, a compact imaging device for a mobile phone is required to be thin, which makes it necessary that the focal length f be small. As f decreases, the size of the image 3 (length of each side) also decreases proportionally; as a result, given that the size of the photosensitive portions 6 remains the same, the number of pixels to be utilized for the detection of the image 3 is reduced, whereby the resolution of the image 3 is degraded. Therefore, in order to maintain a good resolution, the size of the photosensitive portions 6 (length of each side) must also be decreased in proportion with the focal length f.

On the other hand, if f is decreased while keeping the same aperture D, it becomes difficult to conserve the optical performance of the lens system 2. In particular, the off-axis characteristics (i.e., optical characteristics with respect to light which enters with an angle from the lens center axis) are deteriorated. In other words, a large aberration is likely to occur in the higher portion of the image 3 (i.e., a region away from the center axis of the lens system 2; that is, a region away from the center of the photodetector 4), so that the resolution in this region is considerably degraded.

Therefore, in order to maintain a certain optical performance, it is necessary to reduce the aperture D at the same rate as f (thus keeping a constant (so-called) "F value"). In the case where the focal length f, the size of the photosensitive portions 6, and the aperture D are all reduced at the same rate, the light intensity of the image 3 will remain unchanged because the F value stays constant; however, since the size of the photosensitive portions 6 is reduced, the light-receiving areas become smaller, so that the light amount detected by each single photosensitive portion 6 becomes smaller. Thus, when the focal length f is reduced for the pursuit of thinness, it may be either that the resolution of the image 3 will be degraded (in the case where the size of the photosensitive portions 6 remains the same); the optical performance will be deteriorated (in the case where the size of the aperture D remains the same); or even in the case where such performance aspects are all conserved, the light amount detected by each photosensitive portion 6 will still be reduced.

SUMMARY OF THE INVENTION

In order to overcome the problems described above, an objective of the present invention is to provide an imaging device and a photodetector for use in imaging, such that little degradation in brightness occurs even in regions away from the center axis of the photodetector, and that moire fringes are unlikely to occur even when a bright-dark pattern having a pitch close to the pitch Λ of the pixels is projected thereto.

Another objective of the present invention is to provide an imaging device and a photodetector for use in imaging which allow the focal length to be permitted without inviting degradation in the image resolution, degradation in the optical performance of the optical system, or decrease in the light amount detected by each photosensitive portion.

An imaging device according to the present invention comprises: at least three color filters, including first to third color filters having respectively different filtering characteristics; at least three lens systems, including first to third lens systems respectively associated with the first to third color filters; and a photodetection section including a first photodetector for receiving light transmitted through the first color filter and the first lens system, a second photodetector for receiving light transmitted through the second color filter and the second lens system, and a third photodetector for receiving light transmitted through the third color filter and the third lens system, wherein each of the first to third photodetectors has a two-dimensional array of photodetection cells such that centers of the photodetection cells are positioned at apices of triangles sharing respective sides with one another, where none of three corner angles of each triangle is equal to 90°.

In a preferred embodiment, the centers of the photodetection cells are positioned at apices of regular triangles sharing respective sides with one another.

In a preferred embodiment, the centers of the photodetection cells are positioned at centers of hexagons or regular hexagons sharing respective sides with one another.

In a preferred embodiment, each photodetection cell includes: a photosensitive portion; and an optical waveguide for guiding light into the photosensitive portion, and, the optical waveguide comprises a columnar core having a refractive index higher than an ambient refractive index.

In a preferred embodiment, a two-dimensional array of said columnar cores are disposed on the array of photodetection cells.

In a preferred embodiment, each columnar core is shaped so as to be relatively thick at an incident end.

In a preferred embodiment, in any wavelength region other than a first wavelength region, the first color filter has a light transmittance lower than a light transmittance in the first wavelength region; in any wavelength region other than a second wavelength region, the second color filter has a light transmittance lower than a light transmittance in the second wavelength region; in any wavelength region other than a third wavelength region, the third color filter has a light transmittance lower than a light transmittance in the third wavelength region; and the first to third wavelength regions have respectively different central wavelengths.

In a preferred embodiment, in a first wavelength region, the first color filter has a light transmittance lower than a light transmittance in any wavelength region other than the first wavelength region; in a second wavelength region, the second color filter has a light transmittance lower than a light transmittance in any wavelength region other than the second wavelength region; in a third wavelength region, the third color filter has a light transmittance lower than a light transmittance in any wavelength region other than the third wavelength region; and the first to third wavelength regions have respectively different central wavelengths.

In a preferred embodiment, the first wavelength region, the second wavelength region, and the third wavelength region respectively correspond to red, green, and blue.

In a preferred embodiment, the at least three color filters are disposed opposite to the photodetection section with respect to the at least three lens systems.

In a preferred embodiment, the at least three color filters are disposed between the at least three lens systems and the photodetection section.

In a preferred embodiment, the first to third color filters are respectively provided on the first to third photodetectors.

In a preferred embodiment, the number of photodetection cells included in each of the first to third photodetectors is no less than ⅙ and no more than ⅓ of a total number of photodetection cells included in the first to third photodetectors.

In a preferred embodiment, differences between the sizes of images formed on the first to third photodetectors are smaller than the size of each photodetection cell.

In a preferred embodiment, the first to third lens systems have an equal lateral magnification.

In a preferred embodiment, the at least three color filters includes a fourth color filter having filtering characteristics similar to filtering characteristics of one of the first to third color filters; the at least three lens systems include a fourth lens system associated with the fourth color filter; the photodetection section includes a fourth photodetector for receiving light transmitted through the fourth color filter and the fourth lens system; and the fourth photodetector has a two-dimensional array of photodetection cells, each photodetection cell outputting an electrical signal corresponding to an intensity of light received thereby.

In a preferred embodiment, the at least three color filters includes a fourth color filter having filtering characteristics different from filtering characteristics of any of the first to third color filters; the at least three lens systems include a fourth lens system associated with the fourth color filter; the photodetection section includes a fourth photodetector for receiving light transmitted through the fourth color filter and the fourth lens system; and the fourth photodetector has a two-dimensional array of photodetection cells, each photodetection cell outputting an electrical signal corresponding to an intensity of light received thereby.

In a preferred embodiment, the first to fourth color filters are arranged in four quadrants as divided by orthogonal axes on a first plane; the first to fourth lens systems are arranged in four quadrants as divided by orthogonal axes on a second plane, the second plane being parallel to the first plane; and the first to fourth photodetectors are arranged in four quadrants as divided by orthogonal axes on a third plane, the third plane being parallel to the first plane.

In a preferred embodiment, by comparing a light intensity distribution in a predetermined region of the fourth photodetector against a light intensity distribution in a predetermined region of a photodetector selected from the first to third photodetectors, the imaging device detects an amount of an offset between an image formed on the photodetector selected from the first to third photodetectors and an image formed on the fourth photodetector; and based on the amount of the offset, the imaging device determines amounts of relative offsets between images formed on the first to fourth photodetectors, and corrects the electrical signal.

In a preferred embodiment, the predetermined region of each photodetector is located on a line extending from each of four points at which center axes of the first to fourth lens systems respectively intersect surfaces of the first to fourth photodetectors to an intersection between the orthogonal axes on the third plane.

In a preferred embodiment, the imaging device detects the amount of the offset of the image formed on the photodetector by detecting a change over time in the light intensity distribution in the predetermined region of the photodetector; and the imaging device determines a traveling velocity of the image formed on the photodetector based on the amount of the offset, and corrects the electrical signal.

In a preferred embodiment, one of the predetermined regions in the photodetectors is located on one of the lines extending from the four points at which the center axes of the first to fourth lens systems respectively intersect the surfaces of the first to fourth photodetectors to the intersection between the orthogonal axes on the third plane, and another of the predetermined regions in the photodetectors is located on another of the lines.

A photodetector according to the present invention comprises a two-dimensional array of photodetection cells, wherein, centers of the photodetection cells are positioned at apices of triangles sharing respective sides with one another; and none of three corner angles of each triangle is equal to 90°.

Another photodetector according to the present invention comprises a two-dimensional array of photodetection cells, wherein, centers of the photodetection cells are positioned at apices of regular triangles sharing respective sides with one another.

Still another photodetector according to the present invention comprises a two-dimensional array of photodetection cells, wherein, centers of the photodetection cells are positioned at centers of hexagons or regular hexagons sharing respective sides with one another.

In a preferred embodiment, the photodetection cells are partitioned by borders constituting hexagons or regular hexagons; the hexagons or regular hexagons are disposed so that sides thereof are in contact with one another; and light entering each photodetection cell is detected as the light is led through a region surrounded by the hexagons or regular hexagons to a photosensitive portion of the photodetection cell.

Still another photodetector according to the present invention comprises a two-dimensional array of photodetection cells, wherein, each photodetection cell includes: a photosensitive portion; and an optical waveguide for guiding light into the photosensitive portion, and, the optical waveguide comprises a columnar core having a refractive index higher than an ambient refractive index.

In a preferred embodiment, a two-dimensional array of said columnar cores are disposed on the array of photodetection cells.

In a preferred embodiment, each columnar core is shaped so as to be relatively thick at an incident end.

In an imaging device according to the present invention, a set comprising a color filter, a lens system, and a photodetector is provided for each of R, G, and B, for example. Therefore, data representing an image of a different color is obtained from each photodetector, such that a color image can be generated by combining all such data. Moreover, according to the present invention, it is unnecessary to provide a color filter array (which would be patterned pixel-by-pixel) on each photodetector. Since a conventionally-employed lens system is divided into a plurality of lens systems corresponding to e.g. RGB, each lens system can be downsized, thus making it possible to reduce the focal length without sacrificing brightness. Once the focal lengths of the lens systems are reduced, the thickness of the imaging device can be reduced.

The use of such a plurality of lens systems in a parallel arrangement makes it possible to secure the same optical performance even if the focal length is reduced to a half, for example. Because of the reduced focal length, aberrations such as curvature of field can also be reduced proportionately, which leads to a further advantage of being able to provide an ample error margin, in addition to downsizing.

Furthermore, since the pixels are arranged in such a manner that their centers are at apices of isosceles triangles or regular triangles, moire fringes are less likely to occur. Therefore, the pixels can be enlarged to such an extent that their borders are in contact with one another, whereby the moire fringe problem can be drastically improved.

By providing optical waveguides in each photodetector, it becomes possible to greatly improve the utilization efficiency of light entering the photodetector, in particular oblique incident light. As a result, it is no longer necessary to satisfy the telecentric condition at the image side in the optical designing, whereby an increased design freedom is provided.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 2A is a diagram showing the structure of the imaging device of FIG. 1. FIG. 2B is a cross-sectional view of a photodetector for use in imaging which is included in the imaging device of FIG. 1.

DETAILED DESCRIPTION OF PREFERRED EMBODIMENTS

Hereinafter, preferred embodiments of the present invention will be described with reference to the accompanying drawings.

(Embodiment 1)

Figure 8A:
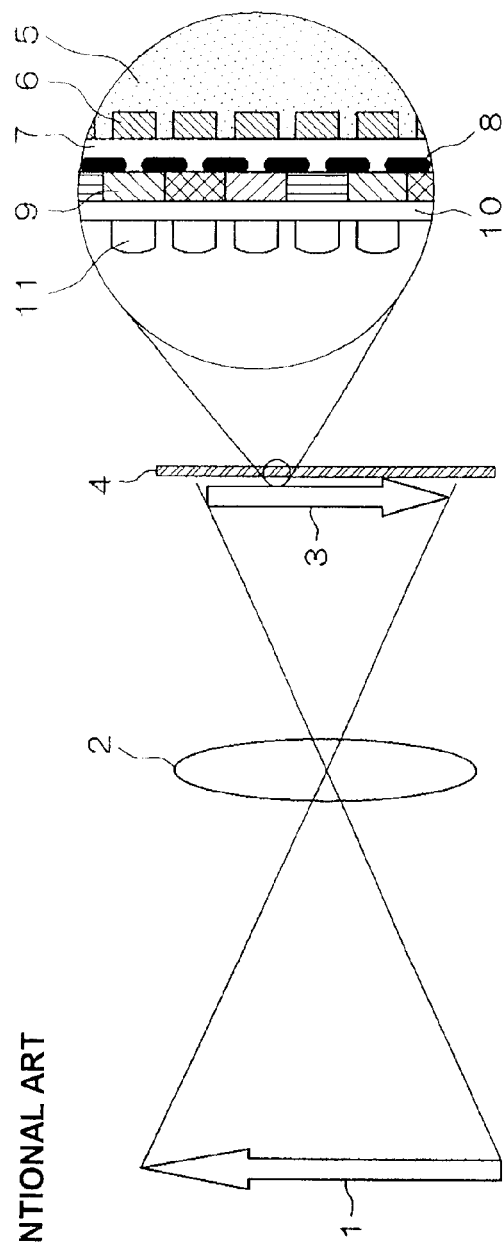
FIG. 8A is a diagram showing the structure of a conventional imaging device.
Figure 8B:
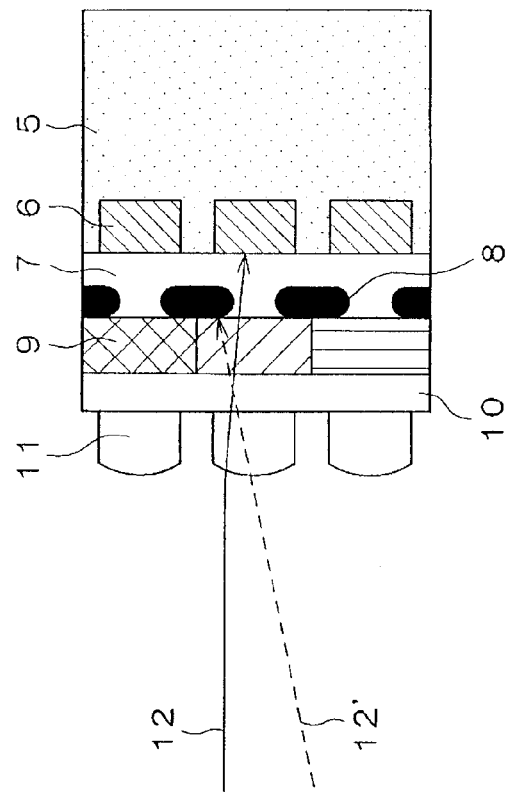
FIG. 8B is a cross-sectional view of a photodetector for use in imaging.
Figure 9A:
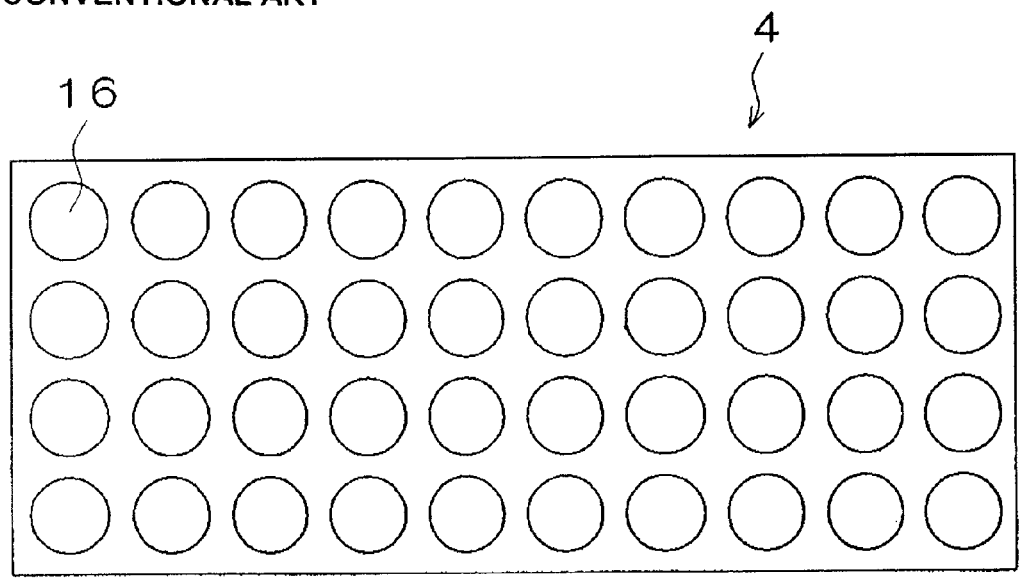
FIG. 9A is an upper plan view showing a pixel arrangement in a photodetector in a conventional imaging device.
Figure 9B:
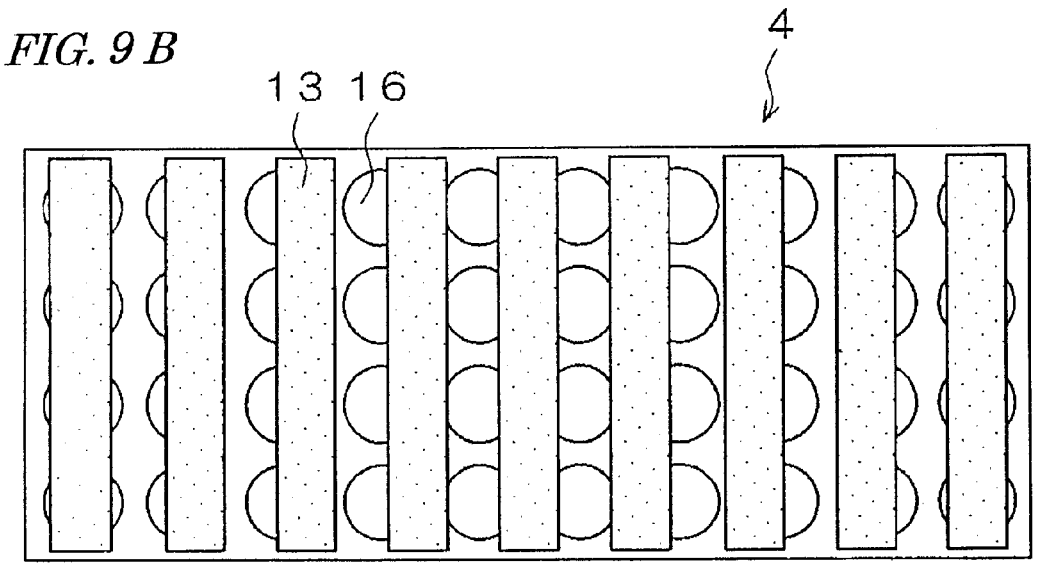
FIG. 9B shows a projection image of a bright-dark pattern on the pixel arrangement.

Hereinafter, with reference to FIGS. 1 to 5, a first embodiment of the imaging device according to the present invention will be described. Those constituent elements which are common to the conventional imaging device shown in FIG. 8 are denoted by the same reference numerals as those used therein.

Figure 1:
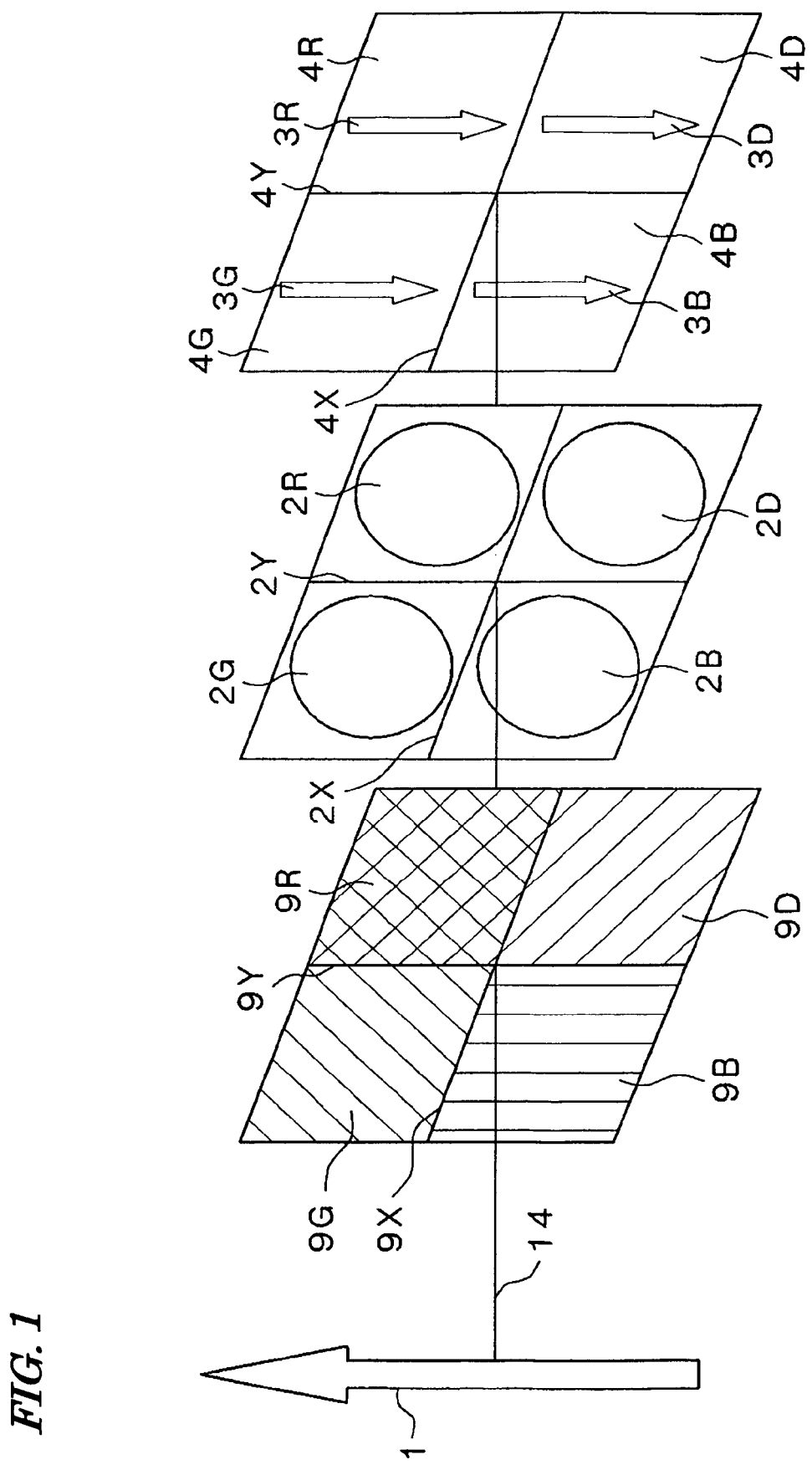
FIG. 1 is a diagram showing the overall structure of an imaging device according to a first embodiment of the present invention.

First, FIG. 1 will be referred to. FIG. 1 is a diagram showing the overall structure of the imaging device of the present embodiment.

A portion of natural light or illumination light which has been reflected by an object 1 passes through color filters 9R, 9G, 9B, and 9D. Via lens systems 2R, 2G, 2B, and 2D, this portion of light forms images 3R, 3G, 3B, and 3D on photodetectors 4R, 4G, 4B, and 4D (which may for example be CCDs or CMOSs), respectively. Each of the lens systems 2R, 2G, 2B, and 2D is preferably a combination of lenses which are arranged along an optical axis in such a manner as to achieve a desired optical performance. However, each lens system will be conveniently described as a single lens for simplicity.

The color filters 9R, 9G, 9B, and 9D are respectively formed in four quadrants on the filter substrate plane as divided by orthogonal coordinate axes 9X and 9Y, and have a substantially zero transmittance for light of wavelengths other than in the vicinity of red, light of wavelengths other than in the vicinity of green, light of wavelengths other than in the vicinity of blue, and light of wavelengths other than in the vicinity of green, respectively. Although the color filters 9R, 9G, 9B, and 9D of the present embodiment are illustrated to be on the same plane in FIG. 1, the color filters 9R, 9G, 9B, and 9D may alternatively be placed on different planes from one another.

Similarly, the lens systems 2R, 2G, 2B, and 2D are respectively formed in four quadrants as divided by orthogonal coordinate axes 2X and 2Y. Similarly, the photodetectors 4R, 4G, 4B, and 4D are four split parts of an otherwise single photodetector, respectively corresponding to four quadrants as divided by orthogonal coordinate axes 4X and 4Y.

The coordinate axes 9X, 2X, 4X are parallel to one another, and the coordinate axes 9Y, 2Y, and 4Y are parallel to one another. The intersections between each pair of orthogonal coordinate axes is on an optical axis 14. The photodetectors 4R, 4G, 4B, and 4D are for red detection, green detection, blue detection, and brightness detection, respectively.

Thus, according to the present embodiment, unlike in the conventional imaging device shown in FIG. 8, no array of color filters differentiated so as to correspond to pixels is provided on the photodetectors. Therefore, each of the photodetectors 4R, 4G, 4B, and 4D has a different structure from that of a conventional photodetector for full-color use, as will be described later in more detail.

In the present embodiment, the lens systems 2R, 2G, 2B, and 2D share the same lateral magnification. As a result, the differences in size between the images 3R, 3G, 3B, and 3D which are projected by the lens systems 2R, 2G, 2B, and 2D onto the photodetectors 4R, 4G, 4B, and 4D, respectively, are no more than one pixel. Therefore, it is possible to easily combine color signals for each pixel based on the signals detected by the photodetectors 4R, 4G, 4B, and 4D.

According to the present embodiment, the same optical performance can be obtained with a focal length which is half of that in the conventional example, assuming that the present embodiment and the conventional example share the same total number of photodetection cells in the photosensitive portions 6 (or total number of pixels), the same area of each photosensitive portion (pixel area), and the same F value of the lens system. In other words, the resolution of the images 3 is not degraded (i.e., the number of pixels remains the same) even if the focal length is reduced to a half. Moreover, the optical performance is not deteriorated (since the F value of each lens system remains the same), and the light amount detected by each photosensitive portion 6 remains unchanged. Thus, there is a tremendous advantage in that it is easy to reduce the thickness of any imaging device which is required to be thin, e.g., a compact imaging device for a mobile phone, without sacrificing optical performance. Because of the reduced focal length, the magnitude of curvature of field and the like can also be reduced proportionately, which leads to an additional advantage of being able to provide an ample error margin.

FIG. 2A shows the structure of the imaging device of the present embodiment. FIG. 2B is a cross-sectional view of a photodetector for use in imaging according to the present embodiment. Although only a portion associated with red detection is illustrated in these figures, it is to be understood that the portions for detecting other colors also have a similar structure.

As shown in FIG. 2A, the photodetector 4R includes a substrate 5, photosensitive portions 6 (e.g., photodiodes) formed on the surface of the substrate 5, a transparent layer 7 covering the surface of the substrate 5, and a light-shielding mask 8 provided on the transparent layer 7. The substrate 5 is typically formed of a silicon substrate. The photosensitive portions 6 can be produced by semiconductor fabrication techniques. On the light-shielding mask 8 is provided a transparent layer 10, which contains a two-dimensional array of optical waveguides 15. On the transparent layer 10, an array of microlenses 11 are formed so as to correspond to the respective optical waveguides 15.

Each unit structure ("photodetection cell") from the photosensitive portion 6 to the microlens 11 operates as a pixel of a single color (whereby the meaning of a "pixel" as used in the following part of the specification is defined). In response to the light which is received by each pixel, an electrical signal is output. This output signal is combined with the output signal from the corresponding pixel (or the corresponding photosensitive portion 6) in each of the other lens systems, whereby a color image is reproduced.

The optical waveguides 15 are formed of a material having a refractive index higher than that of the transparent layer 10. As shown in FIG. 2B, each optical waveguide 15 has a columnar structure extending along the optical axis 14. More specifically, each optical waveguide 15 has an input portion 15a proximate to the microlens 11 and an output portion 15b proximate to the photosensitive portion 6, such that the input portion 15a has a larger diameter than the diameter of the output portion 15b. The end face of the input portion 15a of the optical waveguide 15 is substantially in contact with the microlens 11, and the end face of the output portion 15b is in contact with the transparent layer 7.

In the case where the transparent layer 10 has a refractive index of e.g. 1.5, the refractive index of the optical waveguides 15 is set to be about 2.0, for example. Since light is directed into a higher refractive index medium from a lower refractive index medium, light within the transparent layer 10 which propagates in the neighborhood of each optical waveguide 15 enters the optical waveguide 15.

According to the present embodiment, the color filters 9R, 9G, 9B, and 9D are separated from the photodetectors 4R, 4G, 4B, and 4D as shown in FIG. 1. Therefore, the pixels in each of the photodetectors 4R, 4G, 4B, and 4D may be arranged highly freely, without having to comply with a certain pixel arrangement rule for color filters, e.g., the Bayer pattern.

Figure 5A:
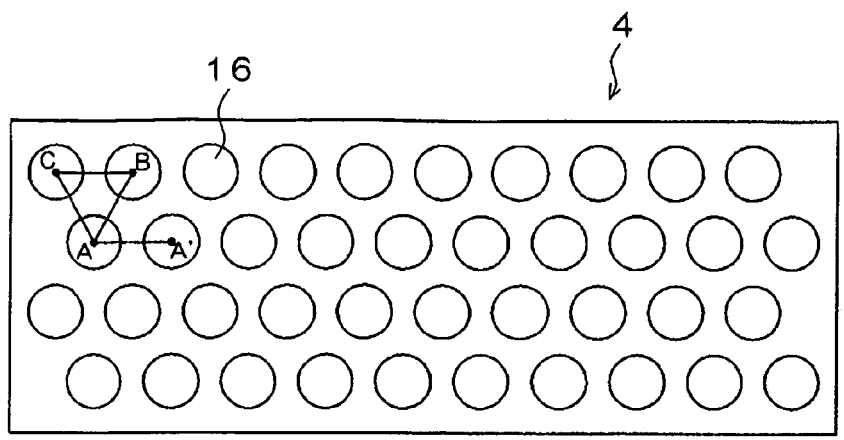
FIG. 5A is an upper plan view showing a pixel arrangement in a photodetector according to the first embodiment.

Specifically, the photodetection cells in each photodetector 4 may be arranged as shown in FIG. 5A. FIG. 5A is an upper plan view showing a pixel arrangement in each photodetector 4 of the imaging device of the present embodiment. The pixels 16 are arranged so that the centers thereof are at the apices of triangles other than right triangles, e.g., an isosceles triangle ABC having equal sides AB and AC or a regular triangle. The interspace between two apices along the horizontal direction (AA' or BC) is equal to a pitch Λ of the pixels 16. Also with respect to the vertical direction, the apices are aligned on horizontal lines which are spaced apart by the pitch A. Note that each pixel 16 corresponds to one photosensitive portion 6.

Figure 5B:
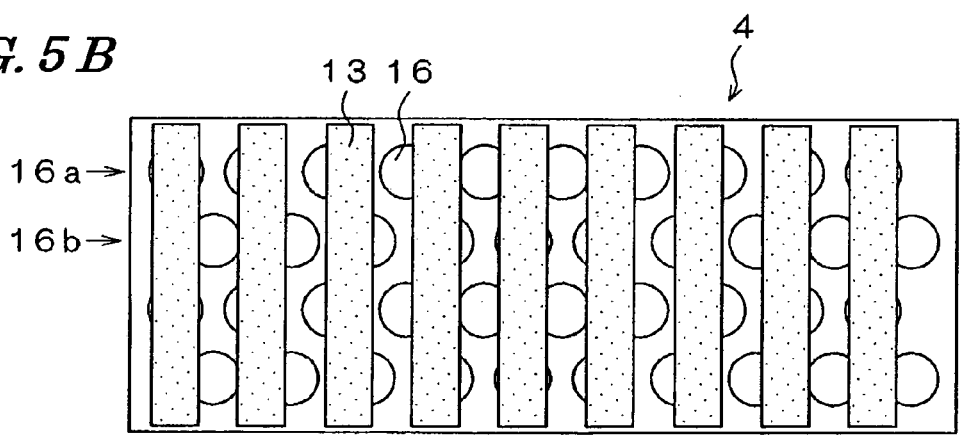
FIG. 5B shows a projection image of an exemplary bright-dark pattern on the pixel arrangement.

FIG. 5B illustrates a case where a bright-dark pattern having a pitch close to the pitch Λ of the pixels 16 is projected on the photodetector 4 (the pitch of the pattern being 10Λ/9 in the illustrated example). In a row denoted by arrow 16a, dark lines 13 in the bright-dark pattern lie upon the pixels 16 at the right and left ends of FIG. 5B, and lie between pixels 16 in the central portion of FIG. 5B. On the other hand, in a row denoted by arrow 16b, the dark lines 13 in the bright-dark pattern lie upon the pixels 16 in the central portion of FIG. 5B, and lie between pixels 16 at the right and left ends of FIG. 5B. Since these rows exist with an equal probability, the pixels 16 appear to be uniformly shaded as a whole, so that no moire fringes occur.

Figure 5C:
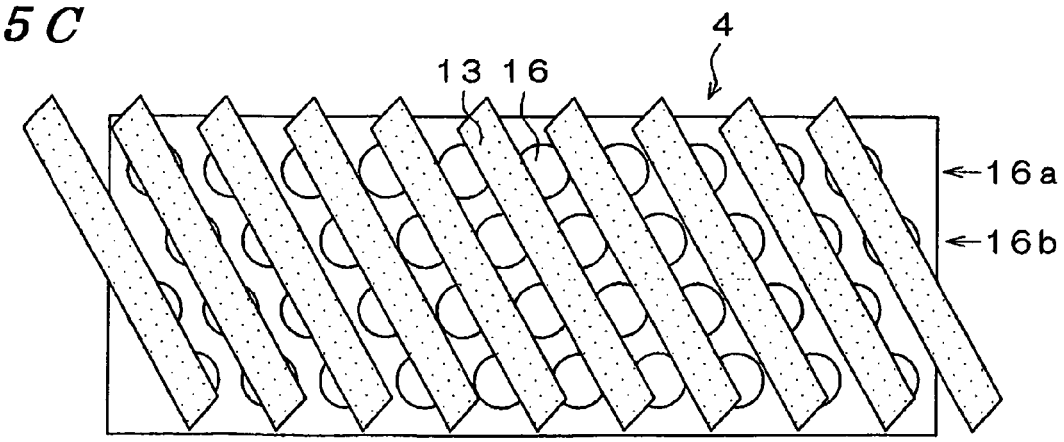
FIG. 5C shows a projection image of another exemplary bright-dark pattern on the pixel arrangement.

However, in the case of a bright-dark pattern shown in FIG. 5C, whose dark lines 13 extend in the direction of the side AC, the dark lines 13 in the bright-dark pattern lie upon the pixels 16 at the right and left ends of FIG. 5C, and lie between pixels 16 in the central portion of FIG. 5C in a row denoted by arrow 16a, and this state is replicated along the direction of the side AC. Therefore, as in the aforementioned conventional example, moire fringes will occur with a bright-dark pattern whose dark lines extend in the direction of the side AC (or side AB or side BC). Note however that, the aforementioned conventional example is plagued by moire fringes if the bright-dark pattern cycles in any of the four directions: the vertical direction, the horizontal direction, and two oblique directions. On the other hand, according to the arrangement of FIG. 5A, moire fringes will occur only with respect to three directions, i.e., the horizontal direction and the two oblique directions. Thus, a certain improvement with respect to moire fringes is obtained.

Referring back to FIG. 2, the photodetection cells which are placed in positions corresponding to the respective pixels are insulated and spaced apart from one another. In these interspaces, interconnects for transferring detected signals are provided. In the case of a CCD, the interspaces will be used for vertical transfer and horizontal transfer. The light-shielding mask 8 is formed so as to overlie each interspace between the photosensitive portions 6, such that each single photosensitive portion 6 is not covered by the light-shielding mask 8. The center of each optical waveguide 15 and the center of each microlens 11 are aligned with the center of the corresponding photosensitive portion 6. Each optical waveguide 15 is formed within a corresponding opening in the light-shielding mask 8.

All photosensitive portions 6 in the two-dimensional array are of the same structure. If an incident ray 12 which is oblique with respect to the center axis of a microlens 11 and has an offset from the center of the microlens 11, the microlens 11 refracts the light so as to be deflected toward the corresponding optical waveguide 15. Thus, the optical waveguide 15 functions to guide such refracted light toward its inside, thus leading the light to the corresponding photosensitive portion 6.

If the ray 12 were obliquely with respect to the center axis of the microlens 11 but traveled through the center of the microlens 11, the refractive effect of the microlens 11 would be small; however, such a ray 12 would travel near the input portion 15a of the optical waveguide 15, thus being drawn into the optical waveguide 15 so as to propagate inside the optical waveguide 15 and reach the photosensitive portion 6. Since the light-receiving efficiency becomes more enhanced as the end face of each optical waveguide 15 proximate to the photosensitive portion 6 is located closer to the photosensitive portion 6, the optical waveguides 15 may extend into the transparent layer 7.

By stacking upon the photosensitive portions 6 a medium having a higher refractive index than that of the transparent layer 7, the medium being partitioned by the transparent layer 7 in between photosensitive portions 6, it will become possible to more effectively take in the light which exits the end faces of the optical waveguides 15, and lead such light to the photosensitive portions 6. Thus, the present embodiment provides a higher utilization efficiency for light entering the photodetectors 6 than in the conventional example. Especially, there is a particular advantage in that oblique incident light (which could not be utilized in the conventional example) can be detected without losses. A further advantage is an increased design freedom, because in the present embodiment it is not necessary to satisfy the telecentric condition at the image side (i.e., rays being parallel to the optical axis at the image side), which was a requirement in the optical designing of the conventional example. Since the optical waveguides 15 provide a high condensation rate, the micro lens 11 may be omitted, thus simplifying the device structure. Alternatively, the incident end of each optical waveguide 15 may be formed integrally with a microlens.

Figure 3A:
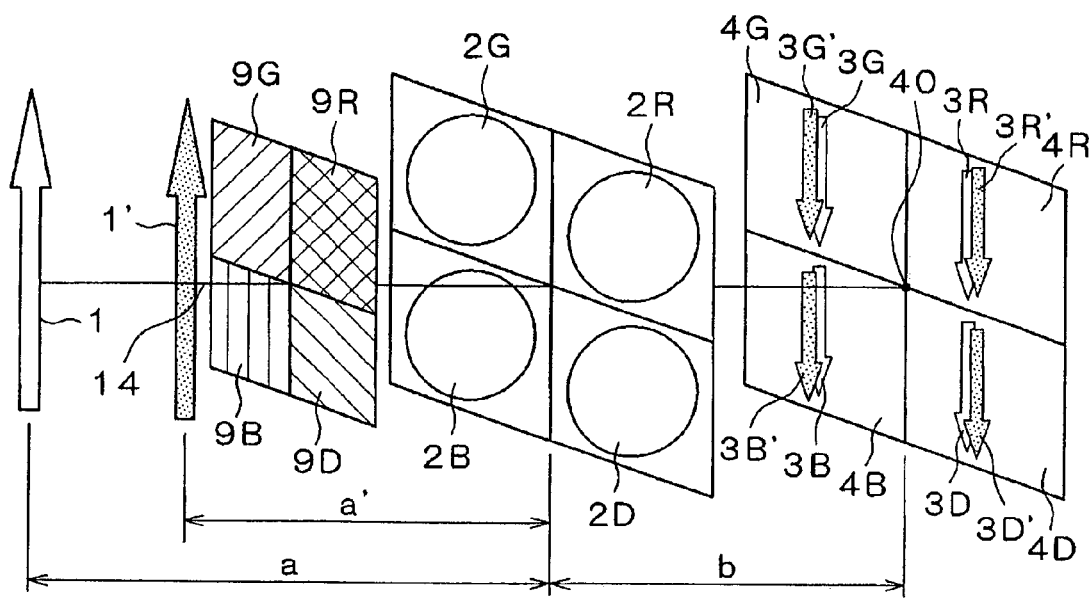
FIG. 3A is a diagram showing a relationship between object positions along an optical axis direction and image positions in the imaging device of FIG. 1.
Figure 3B:
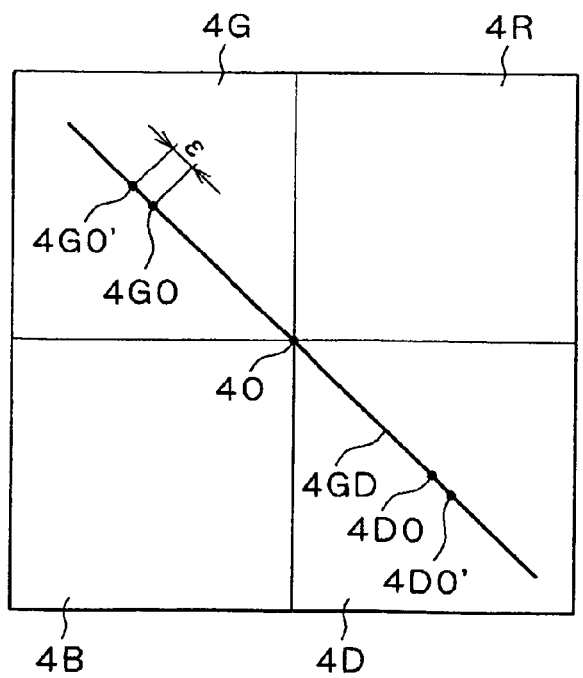
FIG. 3B is a diagram illustrating an offset upon the photodetectors in the imaging device.

FIGS. 3A and 3B are diagrams showing a relationship between object positions along the optical axis direction and image positions in the imaging device of the present embodiment. For an object 1 which is at a distance of a from the lens surface, images 3R, 3G, 3B, and 3D are formed on the detection surface, which is at a distance of b from the lens surface. For an object 1' which is at a distance of a' from the lens surface, since the center of each lens is offset from the optical axis 14 (with an offset of d), the images on the detection surface (which is at the distance of b from the lens surface) are also offset in a radial direction, as centered around an intersection 40 between the optical axis 14 and the detection surface; thus, images 3R', 3G', 3B', and 3D' will result. The offset $\Delta$ between the image of the object 1 and the image of the object 1' is expressed by eq. 1 below:

$$\Delta = \delta b(1/a' - 1/a) \quad \text{(eq. 1)}.$$

In order to reproduce a color image with the imaging device of the present embodiment, it is necessary to combine the respective signals detected by the photodetectors 4R, 4G, 4B, and 4D based on a pixel-by-pixel correspondence, thus obtaining a single synthetic color pixel. When a displacement in the image position as expressed by eq. 1 occurs due to the relative distance of an object, it becomes necessary to correct the pixel shift which is associated with such a displacement in the image position.

The method for this correction may be as follows.

First, as shown in FIG. 3B, by using the photodetectors 4G and 4D, which are placed in diagonal positions from each other, a comparison between detected light amount distributions is performed with respect to pixels along a radial direction 4GD extending through a center point 40. From this comparison, a correlation between the light intensity distribution on the photodetector 4G and the light intensity distribution on the photodetector 4D is ascertained. It is herein assumed that a point 4D0' on the photodetector 4D and a point 4G0' on the photodetector 4G are corresponding pixel positions in the object images. The comparison between corresponding pixel positions could be performed between the photodetectors 4R and 4B instead; however, with the photodetectors 4G and 4D, it is easy to determine the offset between corresponding pixel positions because the photodetectors 4G and 4D form images of the same color.

Assuming that the point 4G0 and the point 4D0 are the center points of the photodetectors 4G and 4D, respectively, the point 4G0 and the point 4D0 are symmetrical points with respect to a center 40. Since the lens systems 2G and 2D are also symmetrical with respect to the optical axis 14, the point 4G0' and the point 4D0' are also symmetrical points with respect to the center 40. The deviation $\epsilon$ of the point 4G0' from the point 4G0 is equal to $\delta$ b/a, assuming that the object position is at the distance of a from the lens. This value is also true to the other photodetection surfaces.

By regarding a point which is obtained by shifting an apparent origin by the deviation $\epsilon$ along a radius (which extends straight through the center 40 and the center of each photodetector) as a new origin of the coordinate system of each photodetector, the corresponding coordinate position in each coordinate system is matched. Thus, the influence of a displacement in the image position can be corrected for, whereby color signal synthesis can be appropriately carried out.

Figure 4A:
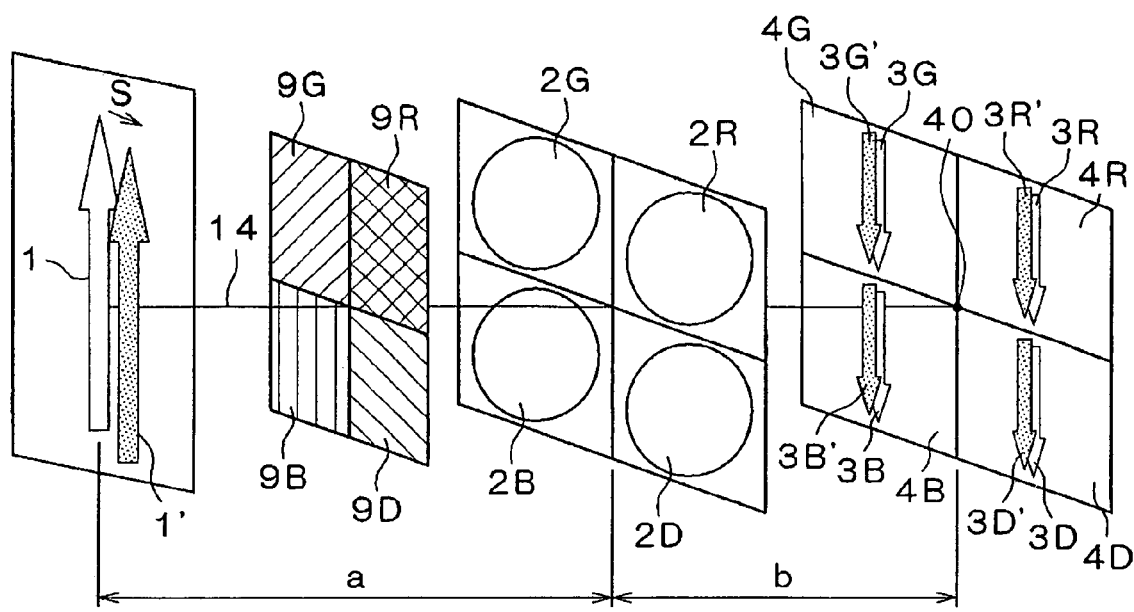
FIG. 4A is a diagram showing a relationship between object positions along a direction perpendicular to the optical axis and image positions in the imaging device of FIG. 1.
Figure 4B:
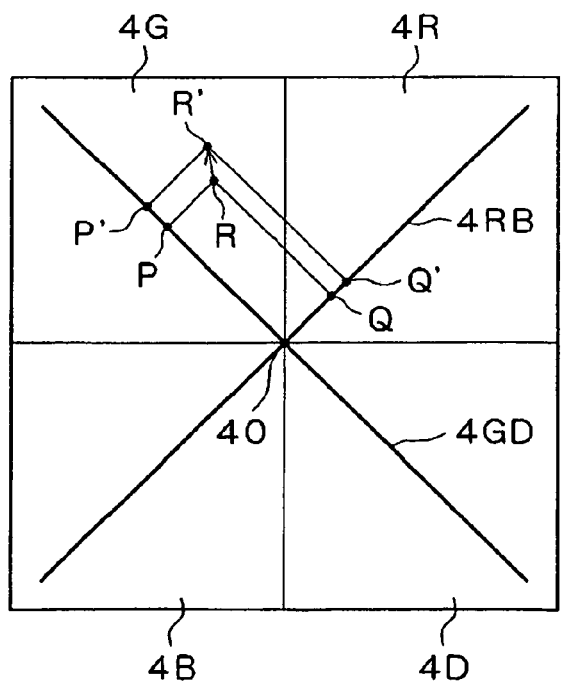
FIG. 4B is a diagram illustrating an offset upon the photodetectors in the imaging device.

FIGS. 4A and 4B are diagrams showing a relationship between object positions along a direction perpendicular to the optical axis and image positions in the imaging device of FIG. 1. For an object 1 which is at a distance of a from the lens surface, images 3R, 3G, 3B, and 3D are formed on the detection surface, which is at a distance of b from the lens surface. If the object 1 moves by a distance d' along an in-plane direction S which is perpendicular to the optical axis 14, the resultant object is regarded as an object 1'. For the object 1', the images on the detection surface (which is at the distance of b from the lens surface) are also offset, but in a direction opposite to the direction S; thus, images 3R', 3G', 3B', and 3D' will result. The offset Δ' between the image of the object 1 and the image of the object 1' is expressed by eq. 2 below:

$$\Delta' = \delta' b/a \qquad \text{(eq. 2)}$$

If such a lateral offset occurs during imaging, the reproduced image will appear blurred along the horizontal direction. Note that, when viewed from the lens side, a camera shake could also be regarded as causing a relative lateral offset of the object with respect to the lenses, similar to the situation illustrated in FIGS. 3A and 3B. As mentioned earlier, in the imaging device of the present embodiment, the respective signals detected by the photodetectors 4R, 4G, 4B, and 4D are combined based on a pixel-by-pixel correspondence. Therefore, if a displacement in the image position occurs as shown in FIGS. 4A and 4B, wrong correspondence would be found between pixels to be combined, thus resulting in miscoloration. Therefore, such an influence needs to be corrected for.

The method for this correction may be as follows.

On the photodetector 4G, with respect to pixels along a radial direction 4GD extending through a center point 40, two light amount distributions are detected with an arbitrary small time lag Δt therebetween, and from a correlation between the two distributions, it is found that the same pixel has been displaced from a point P to a point P' along the radial direction 4GD. On the photodetector 4R, with respect to pixels along a radial direction 4RB extending through the center point 40, two light amount distributions are detected with an arbitrary small time lag Δt therebetween, and from a correlation between the two distributions, it is found that the same pixel has been displaced from a point Q to a point Q' along the radial direction 4RB. In this case, a displacement vector RR' in the image position for the given small time lag Δt is equal to a sum of the vector PP' and the vector QQ'. Therefore, for any image offset caused by a camera shake or the like, a velocity vector which is equal to the vector RR'/Δt may be used, and by regarding a point which is obtained by shifting an apparent origin by a product calculated by multiplying the velocity vector with the time lag Δt as a new origin of the coordinate system of each photodetector, the corresponding coordinate position in each coordinate system is matched. Thus, the correct correspondence between pixels in the image position can be found, and the influence of a displacement in the image position occurring during imaging can be corrected for.

(Embodiment 2)

Figure 6A:
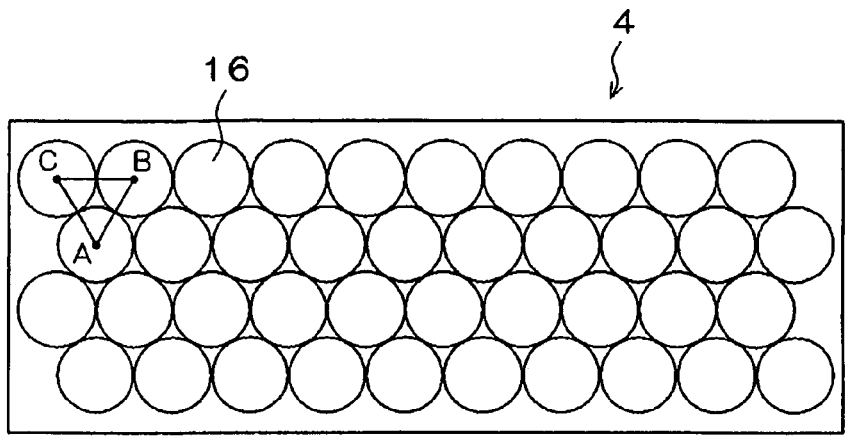
FIG. 6A is an upper plan view showing a pixel arrangement in a photodetector according to a second embodiment.

FIG. 6A is an upper plan view showing a portion of a photodetector 4 in an imaging device according to another embodiment of the present invention. As compared to the photodetector 4 in the imaging device of Embodiment 1 shown in FIG. 5A, the pixels 16 have the same center positions, but each pixel 16 has such a large outer diameter that the pixels 16 are in contact with one another in FIG. 6A. In the present embodiment, the constituent elements other than the photodetector 4 are identical to their counterparts in Embodiment 1, and the detailed description of such elements will be omitted.

Figure 6B:
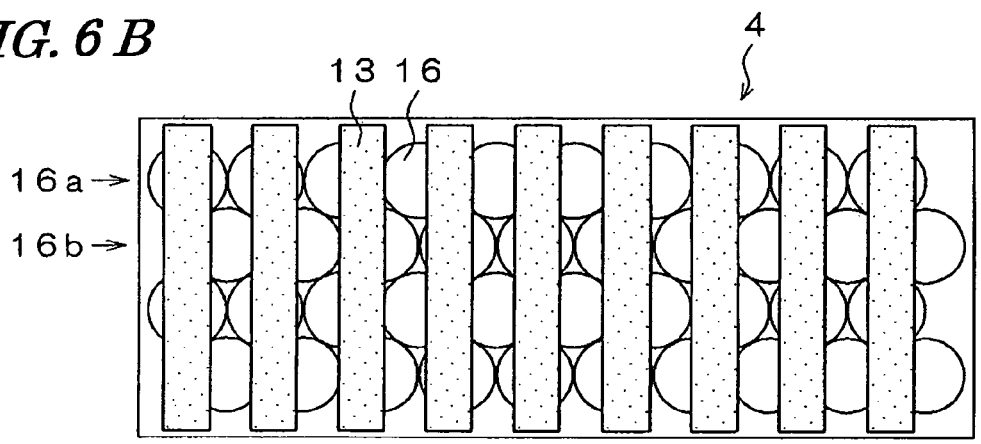
FIG. 6B shows a projection image of an exemplary bright-dark pattern on the pixel arrangement.
Figure 6C:
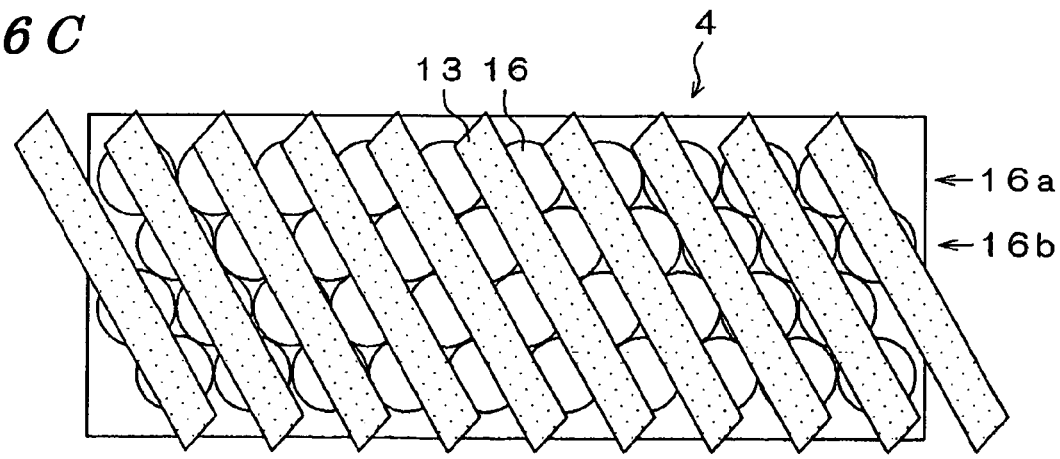
FIG. 6C shows a projection image of another exemplary bright-dark pattern on the pixel arrangement.

FIG. 6B illustrates a case where a bright-dark pattern having a pitch close to the pitch Λ of the pixels 16 is projected on the photodetector 4 (the pitch of the pattern being 10Λ/9 in the illustrated example). In a row denoted by arrow 16a, dark lines 13 in the bright-dark pattern lie upon the pixels 16 at the right and left ends of FIG. 6B, and lie between pixels 16 in the central portion of FIG. 6B; however, the difference between the central portion and the right and left ends is smaller than that in Embodiment 1. On the other hand, in a row denoted by arrow 16b, the dark lines 13 in the bright-dark pattern lie upon the pixels 16 in the central portion of FIG. 6B, and lie between pixels 16 at the right and left ends of FIG. 6B; however, the difference between the central portion and the right and left ends is again smaller than that in Embodiment 1. Since these rows exist with an equal probability, the pixels 16 appear to be uniformly shaded as a whole, so that no moire fringes occur. Furthermore, even in the case of a bright-dark pattern shown in FIG. 6C, whose dark lines 13 extend in the direction of the side AC, the difference between the central portion and the right and left ends is also smaller than that in Embodiment 1, so that moire fringes are less likely to occur. Thus, according to the present embodiment, moire fringes associated with a bright-dark pattern whose dark lines 13 extend in the direction of the side AC (or the side AB or BC) is reduced relative to Embodiment 1.

(Embodiment 3)

Figure 7A:
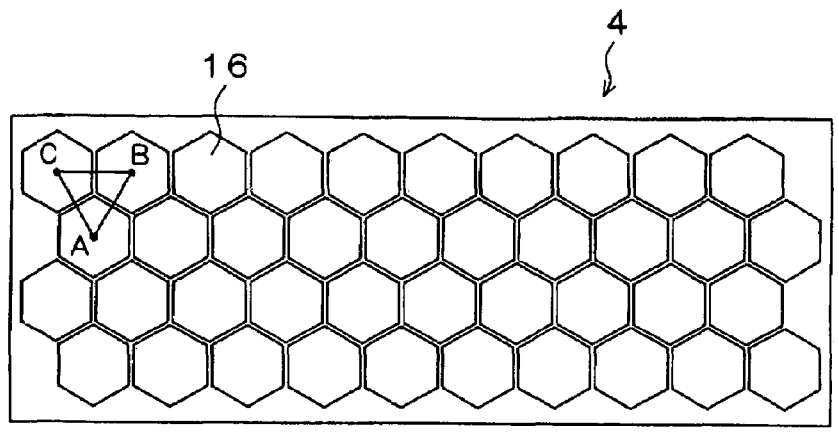
FIG. 7A is an upper plan view showing a pixel arrangement in a photodetector according to a third embodiment.

FIG. 7A is an upper plan view showing a portion of a photodetector 4 in an imaging device according to still another embodiment of the present invention. As compared to the photodetector 4 in the imaging device of Embodiment 2 shown in FIG. 6A, the pixels 16 have the same center positions, but each pixel 16 has a hexagonal outer shape whose sides are in contact with the sides of other pixels in FIG. 7A. In the present embodiment, the constituent elements other than the photodetector 4 are identical to their counterparts in Embodiment 1, and the detailed description of such elements will be omitted.

Figure 7B:
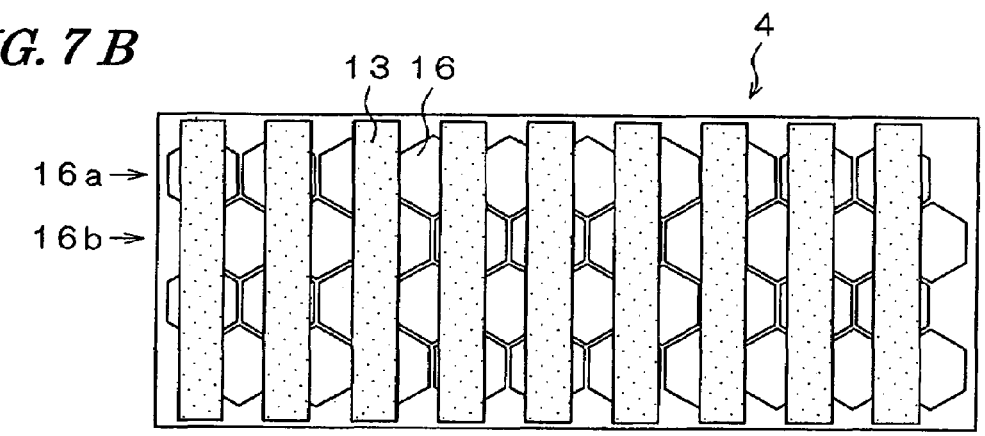
FIG. 7B shows a projection image of an exemplary bright-dark pattern on the pixel arrangement.

FIG. 7B illustrates a case where a bright-dark pattern having a pitch close to the pitch Λ of the pixels 16 is projected on the photodetector 4 (the pitch of the pattern being 10Λ/9 in the illustrated example). In a row denoted by arrow 16a, dark lines 13 in the bright-dark pattern lie upon the pixels 16 at the right and left ends of FIG. 7B, and lie between pixels 16 in the central portion of FIG. 7B; however, the difference between the central portion and the right and left ends is smaller than that in Embodiment 2. On the other hand, in a row denoted by arrow 16b, the dark lines 13 in the bright-dark pattern lie upon the pixels 16 in the central portion of FIG. 7B, and lie between pixels 16 at the right and left ends of FIG. 7B; however, the difference between the central portion and the right and left ends is again smaller than that in Embodiment 2. Since these rows exist with an equal probability, the pixels 16 appear to be uniformly shaded as a whole, so that no moire fringes occur.

Figure 7C:
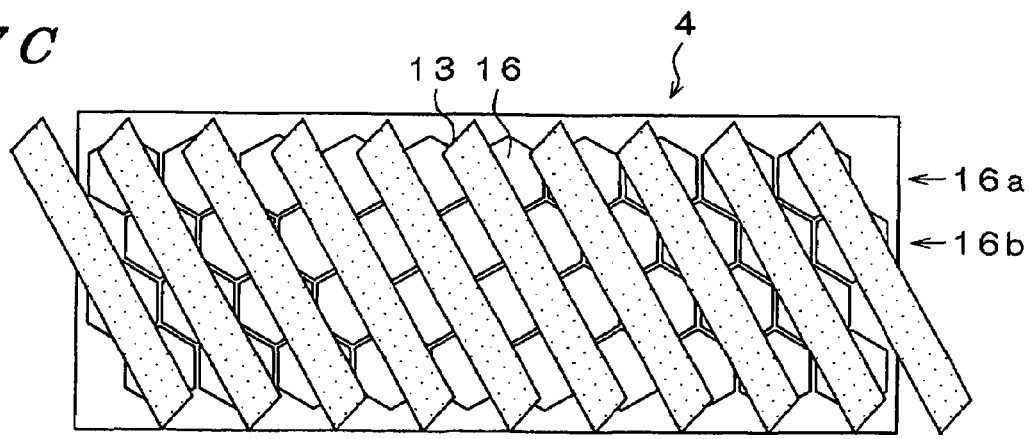
FIG. 7C shows a projection image of another exemplary bright-dark pattern on the pixel arrangement.

Furthermore, even in the case of a bright-dark pattern shown in FIG. 7C, whose dark lines 13 extend in the direction of the side AC, the difference between the central portion and the right and left ends is also smaller than that in Embodiment 2, so that moire fringes are less likely to occur. Thus, according to Embodiment 3, moire fringes associated with a bright-dark pattern whose dark lines 13 extend in the direction of the side AC (or the side AB or BC) is reduced relative to Embodiment 2, not to mention Embodiment 1.

Note that, strictly speaking, the term "pixel (16)" used in FIGS. 5A to 5C, 6A to 6C, and 7A to 7C refers to the effective area through which light entering the photodetector 4 is led to the photosensitive portion 6 and detected thereby. Therefore, it will be appreciated that the cross-sectional shapes of the microlenses 11, the optical waveguides 15, and the photosensitive portions 6 may be different from the pixel shapes shown in FIGS. 5A to 5C, 6A to 6C, and 7A to 7C.

In the above-described embodiments, the color filters 9R, 9G, and 9B are illustrated as having a substantially zero transmittance for light of wavelengths other than in the vicinity of red, light of wavelengths other than in the vicinity of green, and light of wavelengths other than in the vicinity of blue, respectively. Alternatively, the color filters 9R, 9G, and 9B may cut off light of colors other than the respective complementary colors of the above, i.e., the color filters 9R, 9G, and 9B may have a substantially zero transmittance for light of wavelengths in the vicinity of red, light of wavelengths in the vicinity of green, and light of wavelengths in the vicinity of blue, respectively (thus being so-called cyan, magenta, and yellow color filters).

In order to create a full-color image, three color filters (red, green, and blue; or their respective complementary colors, i.e., cyan, magenta, and yellow) would suffice. Therefore, the fourth set of color filter 9D, the lens system 2D, and the photodetector 4D may be omitted. In this case, the lens systems 2R, 2G, and 2B are to be disposed in three regions which are partitioned by angles of 120° within the same plane.

Although the imaging device in each of the above embodiments is illustrated as having the fundamental structure as shown in FIG. 1, the pixel arrangement described in each embodiment may alternatively be applied to an imaging device equipped with a conventional optical system. For example, each pixel arrangement may be adopted in combination with any structure having a filter layer in which red, green, and blue filters are provided for each and every pixel, as in the conventional photodetector shown in FIG. 8.

The imaging device of the present invention is applicable to a thin-type camera and the like.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2004-103771 filed Mar. 31, 2004 and No. 2005-088685 filed Mar. 25, 2005, the entire contents of which are hereby incorporated by reference.

What is claimed is:

1. An imaging device comprising:
   at least three color filters, including first to third color filters having respectively different filtering characteristics;
   at least three lens systems, including first to third lens systems respectively associated with the first to third color filters; and
   a photodetection section including a first photodetector for receiving light transmitted through the first color filter and the first lens system, a second photodetector for receiving light transmitted through the second color filter and the second lens system, and a third photodetector for receiving light transmitted through the third color filter and the third lens system,
   wherein each of the first to third photodetectors has a two-dimensional array of photodetection cells such that centers of the photodetection cells are positioned at apices of triangles sharing respective sides with one another, where none of three corner angles of each triangle is equal to 90°.

2. The imaging device of claim 1, wherein the centers of the photodetection cells are positioned at apices of regular triangles sharing respective sides with one another.

3. The imaging device of claim 1, wherein the centers of the photodetection cells are positioned at centers of hexagons or regular hexagons sharing respective sides with one another.

4. The imaging device of claim 1, wherein,
   each photodetection cell includes:
   a photosensitive portion; and
   an optical waveguide for guiding light into the photosensitive portion, and,
   the optical waveguide comprises a columnar core having a refractive index higher than an ambient refractive index.

5. The imaging device of claim 4, wherein a two-dimensional array of said columnar cores are disposed on the array of photodetection cells.

6. The photodetector of claim 5, wherein each columnar core is shaped so as to be relatively thick at an incident end.

7. The imaging device of claim 1, wherein,
   in any wavelength region other than a first wavelength region, the first color filter has a light transmittance lower than a light transmittance in the first wavelength region;
   in any wavelength region other than a second wavelength region, the second color filter has a light transmittance lower than a light transmittance in the second wavelength region;
   in any wavelength region other than a third wavelength region, the third color filter has a light transmittance lower than a light transmittance in the third wavelength region; and
   the first to third wavelength regions have respectively different central wavelengths.

8. The imaging device of claim 1, wherein,
   in a first wavelength region, the first color filter has a light transmittance lower than a light transmittance in any wavelength region other than the first wavelength region;
   in a second wavelength region, the second color filter has a light transmittance lower than a light transmittance in any wavelength region other than the second wavelength region;
   in a third wavelength region, the third color filter has a light transmittance lower than a light transmittance in any wavelength region other than the third wavelength region; and
   the first to third wavelength regions have respectively different central wavelengths.

9. The imaging device of claim 1, wherein the first wavelength region, the second wavelength region, and the third wavelength region respectively correspond to red, green, and blue.

10. The imaging device of claim 1, wherein the at least three color filters are disposed opposite to the photodetection section with respect to the at least three lens systems.

11. The imaging device of claim 1, wherein the number of photodetection cells included in each of the first to third photodetectors is no less than 1/6 and no more than 1/3 of a total number of photodetection cells included in the first to third photodetectors.

12. The imaging device of claim 1, wherein differences between the sizes of images formed on the first to third photodetectors are smaller than the size of each photodetection cell.

13. The imaging device of claim 12, wherein the first to third lens systems have an equal lateral magnification.

14. The imaging device of claim 1, wherein,
the at least three color filters includes a fourth color filter having filtering characteristics similar to filtering characteristics of one of the first to third color filters;
the at least three lens systems include a fourth lens system associated with the fourth color filter;
the photodetection section includes a fourth photodetector for receiving light transmitted through the fourth color filter and the fourth lens system; and
the fourth photodetector has a two-dimensional array of photodetection cells, each photodetection cell outputting an electrical signal corresponding to an intensity of light received thereby.

15. The imaging device of claim 1, wherein,
the at least three color filters includes a fourth color filter having filtering characteristics different from filtering characteristics of any of the first to third color filters;
the at least three lens systems include a fourth lens system associated with the fourth color filter;
the photodetection section includes a fourth photodetector for receiving light transmitted through the fourth color filter and the fourth lens system; and
the fourth photodetector has a two-dimensional array of photodetection cells, each photodetection cell outputting an electrical signal corresponding to an intensity of light received thereby.

16. The imaging device of claim 15, wherein,
the first to fourth color filters are arranged in four quadrants as divided by orthogonal axes on a first plane;
the first to fourth lens systems are arranged in four quadrants as divided by orthogonal axes on a second plane, the second plane being parallel to the first plane; and
the first to fourth photodetectors are arranged in four quadrants as divided by orthogonal axes on a third plane, the third plane being parallel to the first plane.

17. An imaging device comprising:
at least three color filters, including first to third color filters having respectively different filtering characteristics;
at least three lens systems, including first to third lens systems respectively associated with the first to third color filters; and
a photodetection section including a first photodetector for receiving light transmitted through the first color filter and the first lens system, a second photodetector for receiving light transmitted through the second color filter and the second lens system, and a third photodetector for receiving light transmitted through the third color filter and the third lens system,
wherein each of the first to third photodetectors has a two-dimensional array of photodetection cells such that centers of the photodetection cells are positioned at apices of triangles sharing respective sides with one another, where none of three corner angles of each triangle is equal to 90°;
the at least three color filters includes a fourth color filter having filtering characteristics different from filtering characteristics of any of the first to third color filters;
the at least three lens systems include a fourth lens system associated with the fourth color filter;
the photodetection section includes a fourth photodetector for receiving light transmitted through the fourth color filter and the fourth lens system;
the fourth photodetector has a two-dimensional array of photodetection cells, each photodetection cell outputting an electrical signal corresponding to an intensity of light received thereby;
the first to fourth color filters are arranged in four quadrants as divided by orthogonal axes on a first plane;
the first to fourth lens systems are arranged in four quadrants as divided by orthogonal axes on a second plane, the second plane being parallel to the first plane;
the first to fourth photodetectors are arranged in four quadrants as divided by orthogonal axes on a third plane, the third plane being parallel to the first plane; and
wherein, by comparing a light intensity distribution in a predetermined region of the fourth photodetector against a light intensity distribution in a predetermined region of a photodetector selected from the first to third photodetectors, the imaging device detects an amount of an offset between an image formed on the photodetector selected from the first to third photodetectors and an image formed on the fourth photodetector; and
based on the amount of the offset, the imaging device determines amounts of relative offsets between images formed on the first to fourth photodetectors, and corrects the electrical signal.

18. The imaging device of claim 17, wherein the predetermined region of each photodetector is located on a line extending from each of four points at which center axes of the first to fourth lens systems respectively intersect surfaces of the first to fourth photodetectors to an intersection between the orthogonal axes on the third plane.

19. The imaging device of claim 18, wherein,
the imaging device detects the amount of the offset of the image formed on any of the first to fourth photodetectors by detecting a change over time in the light intensity distribution in the predetermined region of the photodetector; and
the imaging device determines a traveling velocity of the image formed on the photodetector based on the amount of the offset, and corrects the electrical signal.

20. The imaging device of claim 19, wherein one of the predetermined regions in the photodetectors is located on one of the lines extending from the four points at which the center axes of the first to fourth lens systems respectively intersect the surfaces of the first to fourth photodetectors to the intersection between the orthogonal axes on the third plane, and another of the predetermined regions in the photodetectors is located on another of the lines.

* * * * *